United States Patent [19]
Roller

[11] Patent Number: 5,838,328
[45] Date of Patent: Nov. 17, 1998

[54] METHOD FOR GENERATING GRAPHICAL MODELS AND COMPUTER AIDED DESIGN SYSTEM

[75] Inventor: Dieter Roller, Schönaich, Germany

[73] Assignee: Hewlett-Packard Company, Palo Alto, Calif.

[21] Appl. No.: 76,285

[22] Filed: Jun. 11, 1993

Related U.S. Application Data

[63] Continuation of Ser. No. 525,101, May 17, 1990, abandoned, which is a continuation-in-part of Ser. No. 360,494, Jun. 2, 1989, abandoned.

[30] Foreign Application Priority Data

May 19, 1989 [EP] European Pat. Off. .............. 89108990

[51] Int. Cl.$^6$ ............................ G06T 17/00; G06F 17/50
[52] U.S. Cl. .......................... 345/420; 345/964; 345/441; 707/502
[58] Field of Search ................................... 395/120, 161, 395/141, 136; 364/474.24, 474.22, 474.23, 474.36; 345/420, 441, 436, 964; 707/502

[56] References Cited

U.S. PATENT DOCUMENTS

| 4,864,520 | 9/1989 | Setoguchi et al. .................. 345/420 X |
| 4,926,311 | 5/1990 | Matsumura et al. ........... 364/474.22 X |
| 4,933,865 | 6/1990 | Yamamoto et al. ........... 364/474.24 X |
| 4,984,180 | 1/1991 | Wada et al. .................... 364/474.24 X |
| 5,070,534 | 12/1991 | Lascelles et al. ................... 345/441 X |

FOREIGN PATENT DOCUMENTS

| 0218246 | 4/1987 | European Pat. Off. . |
| WO 88/03290 | 5/1988 | WIPO . |

OTHER PUBLICATIONS

Gossard, et al., "Representing Dimensions, Tolerances, And Features In MCAE Systems", Mass. Institute of Technology, Mar. 1988, IEEE, pp. 51–59.
Autocad Release 10, Reference Manual, Sep. 1988, pp. 121–124.
Machine Design, vol. 59, No. 6, 26th Mar. 1987, p. 56.
Light et al., "Modification of Geometric Models Through Variational Geometry", *Computer–Aided Design*, vol. 14 No. 1, Jan. 1982, pp. 209–214.
Chyz, "Constraint Management for Constructive Geometry", Department of Mechanical Engineering, MIT, 1985.
HP Design, HP 98355A, Technical Description, Nov. 1984.
Kawagoe et al., "Parametric Object Model: A Geometric Data Model for Computer–Aided–Engineering", NEC Research and Development, Jan. 1984.
*EASY CAD* Version 1.08 User's Manual, Jun. 1987, pp. 109–114.

Primary Examiner—Raymond J. Bayerl

[57] ABSTRACT

A computer aided design system generates graphical models of 2- or 3-dimensional objects with at least partially variable dimensions, in particular mechanical parts. In order to generate models having a predetermined plurality of structural elements, like through-holes, etc. being distributed over the model in a predetermined manner, the computer aided design system is provided with means for selecting a sub-group of design commands corresponding to a structural element of the model. After inputting a replication command, the selected element is replicated in a predetermined manner, e.g., distributed either by rotation about a predetermined center point at predetermined angular steps or shifted along linear axes with predetermined spacings or scaled at predetermined locations.

1 Claim, 7 Drawing Sheets

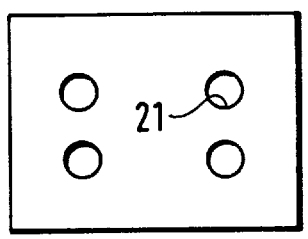
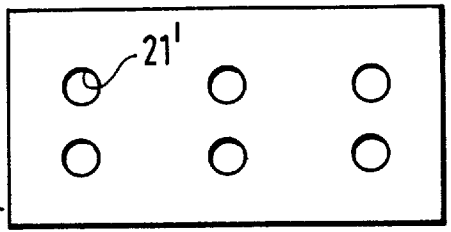
FIG. 4A　　　　　　　　　FIG. 4B
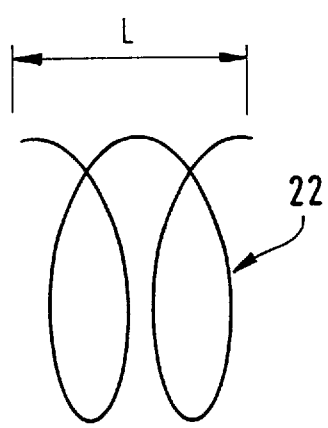
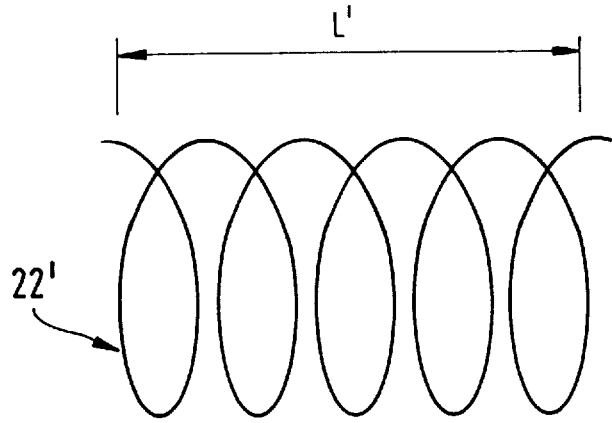
FIG. 5A　　　　　　　　　FIG. 5B
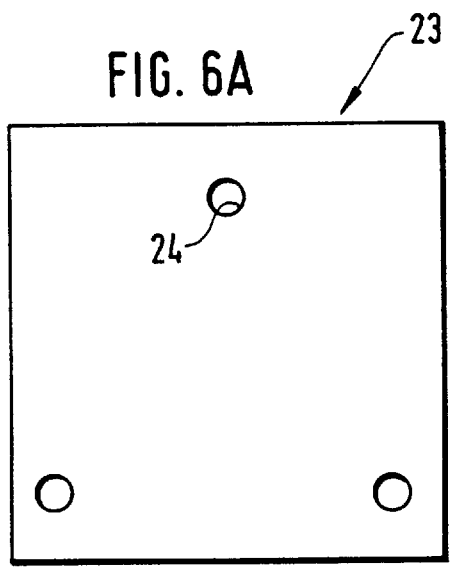
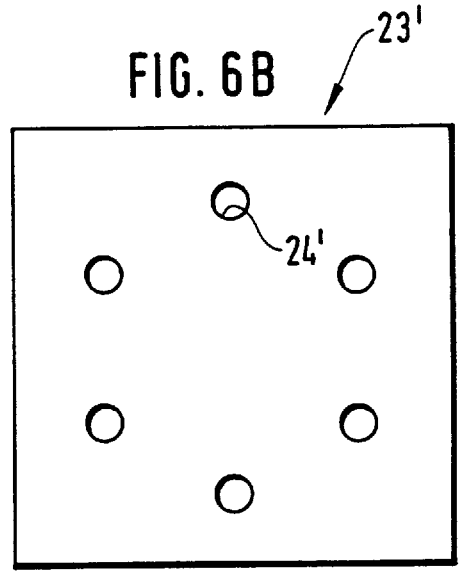
FIG. 6A　　　　　　　　　FIG. 6B

CONSTRAINT ICONS:

⊙ = CONCENTRIC

∼ = FIT BETWEEN CONNECTION POINTS $A_1 = 30$    $R_4 = 5$
$A\_DEL = 150$  $R_5 = 60$
$R_1 = 5$    $N_1 = 2$
$R_2 = 100$   $RA_1 = 180$
$R_3 = 75$ $A_1 = 75$
$A\_DEL = 30$
$R_1 = 40$
$R_2 = 100$
$R_3 = 85$
$R_4 = 3$
$R_5 = 20$
$N_1 = 8$
$RA_1 = 45$

METHOD FOR GENERATING GRAPHICAL MODELS AND COMPUTER AIDED DESIGN SYSTEM

This is a continuation of application Ser. No. 525,101, filed May 17, 1990, now abandoned, which is a continuation-in-part of application Ser. No. 07/360,494, filed Jun. 2, 1989, now abandoned.

FIELD OF INVENTION

This invention relates to methods and apparatus for generating graphical models in a computer aided design system using design commands of 2- or 3-dimensional objects with at least partially variable dimensions, for example mechanical parts. More particularly, this invention, relates to a computer aided design system, having at least one user input interface, preferably a keyboard and/or a graphics tablet, at least one user output interface, preferably a screen with graphics capabilities and/or a plotter and a digital processor, connected with the user input interface and the user output interface, and having a program memory containing instructions to operate the digital processor.

BACKGROUND OF THE INVENTION

A method and a system of the aforementioned kind are described in U.S. patent application Ser. No. 07/360,494, filed Jun. 2, 1989. The aforementioned patent application, owned by the same entity as the present application, discloses various details of computer aided design methods and systems, and the disclosure of that application is herewith incorporated into the present application by reference.

Computer aided design (CAD) systems are used to build graphical models and graphical drawings of mechanical parts in an interactive mode. That is, geometry and dimensions are entered by a user through the use of well-known input means such as keyboards, graphic tablets, mouses, etc., whereupon such models and drawings are shown on a high-resolution cathode ray tube (CRT) and thereafter plotted. A common technique is to enter fixed values for the dimensions of a mechanical part to be drawn. This technique has the disadvantage in that it is rather cumbersome to alter the dimensions at a later stage of the design process.

It has already been tried to build CAD systems having a two step operation first the entry of variable dimensions, i.e., the entry of a symbolic value or label representing certain dimensions, during the design process and second the replacement of such value by an actual dimension in order to create the actual part. For the purpose of this application, such a first step will be called "object entry mode" and such a second step will be called "retrieval mode." CAD systems which allow the input of symbolic dimensions are particularly important for the creation of part families, i.e., creation of parts with principally the same shape, but differing dimensions. Such CAD systems are further used for the design of parts, the dimensions of which have not yet been finally defined.

The above-mentioned U.S. Patent application discusses various prior CAD methods and systems, including the method of variant programming, the interactive variant design with sequential calculation of the geometrical points of a variant and the interactive variant design with simultaneous calculation of the geometrical points.

Examples of such prior techniques are also described in HP-DESIGN, HP 98355A, Technical Description, November 1984; in the book of Light, R. and Gossard, D. MODIFICATION OF GEOMETRIC MODELS THROUGH VARIATIONAL GEOMETRY, Computer Aided Design, Volume 14, Jul. 4, 1982, Butterworth & Co. Ltd.; and, further, in a Master Thesis of Chyz, G. in CONSTRAINT MANAGEMENT FOR CONSTRUCTIVE GEOMETRY, Department of Mechanical Engineering, MIT, 1985. Further prior computer aided design methods and systems are described in an article of Gossard, D. C., R. P. Zuf fante and H. Sakurai, entitled "REPRESENTING DIMENSIONS, TOLERANCES, AND FEATURES IN MCAE SYSTEMS", published in US-Z-IEEE Computer Graphics and Applications, March 1988.

When considering the above referenced application and publications, one can conclude that the problem of interactive design with dimensional parameters has been adequately solved. However, recent progress in design methodologies for CAD systems has brought a new aspect to the problem of parametric design. More precisely, there is a need for future CAD systems supporting the design process to have high-level form features such as hole patterns, hinges, complex through holes, etc., as opposed to the simple geometric primitives like points, lines, surfaces and elementary bodies described in the previously listed reference. A survey on this high-level form feature design is given in a Report of J. Shah, entitled "CURRENT STATUS OF FEATURES TECHNOLOGY", Report No. R-88-GM-04.1, CAD-I Computer Aided Manufacturing International, Arlington, Tex., 1988.

SUMMARY OF THE INVENTION

It is, therefore, an object of the present invention to make CAD systems more "intelligent" with respect to the support of design decisions, particularly by providing an interactive generation of parametric designs with structural parameters in addition to dimensional parameters.

According to the method of the present invention, this object is achieved by the steps of selecting a sub-group of geometric elements or design commands corresponding to a structural element of a model;

inputting a replication command; and generating a generic design program which includes the replication commands in an unexecuted form so that when the design of a given object is to be displayed, the replication commands operates to replicate the design commands to generate a model being provided with a plurality of the replicated structural elements.

According to the system of the present invention, this object is achieved by a user input interface having a set of design command entry devices, preferably keys on a graphic tablet which are logically divided into at least two sub-groups in the first sub-group each command being associated with a primary design feature;

in the second sub-group each command being associated with a replication feature; and a program memory containing instructions to select a sub-group of geometric elements or design commands corresponding to a structural element of said model; and to generate a generic design program which includes the replication commands in an unexecuted form so that when the design of a given object is to be displayed, the replication commands operates to replicate the geometric elements or design commands therefore to provide a model having a predetermined plurality of the replicated structural elements.

Since the invention provides for replications in a variable mode, i.e. the number of replications as well as their position parameters may vary from variant to variant, the invention results in a tremendous effectivity increase in interactive design with CAD systems since significantly more particular designs can be generated automatically out of a generic design.

In one embodiment of the method according to the invention, the replication command comprises a rotation command for arranging a plurality of structural elements in a rotational or circular distribution about a predetermined center point in predetermined angular steps. These features have the advantage that rotational parts like wheels, etc. may be easily modified in an interactive manner by increasing the number of eccentric gaps, mounting holes, etc. by distributing a predetermined plurality of the aforementioned elements about an inner or outer periphery of the wheel without the necessity of entirely redesigning any of these variants.

In another embodiment of the method according to the invention, the replication command comprises a shift command for arranging the plurality of structural elements in a linear distribution along a predetermined axis in predetermined spacings. Preferably, the axis is a horizontal or vertical axis. Again, these features offer the advantage of easily modifying a model having larger dimensions either in the horizontal or vertical direction by increasing the number of through-holes or gaps, possibly according to certain design rules in an automatic way.

Still further, according to another embodiment of the invention, the replication command comprises a scaling command for arranging the plurality of structural elements in a predetermined distribution at predetermined locations in predetermined scalings. This feature, too, offers the advantage of easily modifying a given model by distributing the aforementioned structural elements in different scalings at any conceivable locations.

In still further embodiments of the method according to the invention, the design commands are executed either in a fixed mode in which the number of replications to be performed as well as their locations are fixed, or in a variable mode in which the number of replications to be performed as well as their locations are given as variables, or a combination thereof. When features known from the above-mentioned U.S patent application are added to the present invention, the resulting method offers the advantage of either simplifying the predetermination of fixed values or offering additional design perspectives in that the replication mode is made variable.

Seen as a whole, the method and the system according to the invention offer substantial advantages to the user by saving time for construction of complex objects. This stems from the novel principle of interactive generation of a generic design with unlimited (variable) numbers of structural elements as well as variable positions of such elements.

In a given example of a wheel with a predetermined number of gaps, as will be described below in connection with the drawings, a comparison was made with prior techniques. In order to program the aforementioned example in a prior high-level language, a medium-experienced user typically would need about 4 hours. With an interactive dimension-driven CAD system based on prior technology, this example cannot be carried out at all, because the maximum number of eccentric holes that might appear in practice is not known at the time of doing the master design. However, assuming as an example the maximum number of holes to be 36, the 36 eccentric holes would have to be designed explicitly with distinguished dimension variables. This then would allow parameters to be reset to zero for an arbitrary number of the designed eccentric gaps and, thus, produce variants with different numbers of gaps. The design time in that case, in spite of the limited flexibility of the number of gaps—is still about 3 hours.

With the method and the system according to the present invention, the complete design takes only about 10 minutes. As can be seen, the method and the system according to the invention can raise the efficiency of a parametric design system by orders of magnitudes and, thus, save enormous costs in the design phase.

All of the features, discussed hereinbefore or hereinafter, may not only be used in the particular combination as described but, also, in other combinations, or alone without departing from the scope of the present invention.

BRIEF DESCRIPTION OF THE DRAWINGS

The accompanying drawings depict preferred embodiments of the present invention. In particular, further features and advantages of the invention may be apparent in this detailed description. In the drawings.

FIGS. 4A to 6B illustrate various examples of structural design changes;

DETAILED DESCRIPTION

Figure 1A:
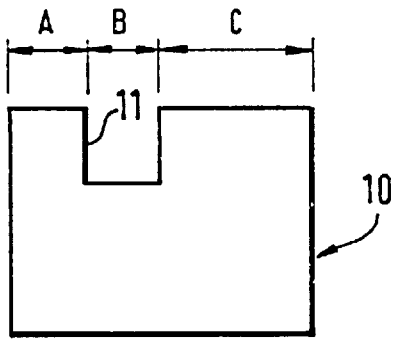
FIGS. 1A to 3B illustrate how dimensional changes relate to topological structure.
Figure 1B:
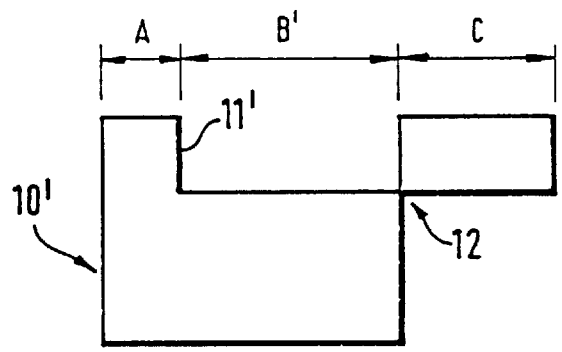

Consider first a few examples of topology consequences resulting from dimensional changes. FIG. 1A shows a first planar design 10 of essentially rectangular shape with a gap 11 being arranged on the upper margin and also having a rectangular shape. The respective dimensions are referred to as A, B, and C. If dimension B is now modified into B' as depicted by modified planar design 10 in FIG. 1B, the configuration may become unrealistic if B' becomes equal to or greater than the sum of B and C, as can clearly be seen in FIG. 1B at 12.

Figure 2A:
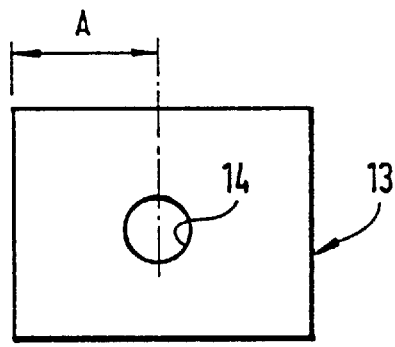
Figure 2B:
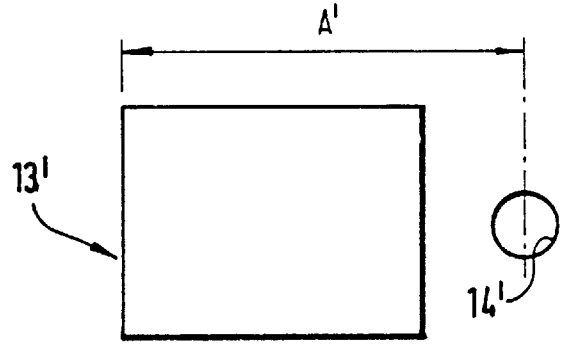

Another example of topology consequences as a result of dimensional changes is depicted in FIG. 2A with a second planar design 13 of rectangular shape being provided with, a circular hole 14 at a distance A from the left margin. If dimension A is modified to A as depicted in FIG. 2B by modified planar design 13', then it may be that the hole 14' is caused to be outside of design 13'.

Figure 3A:
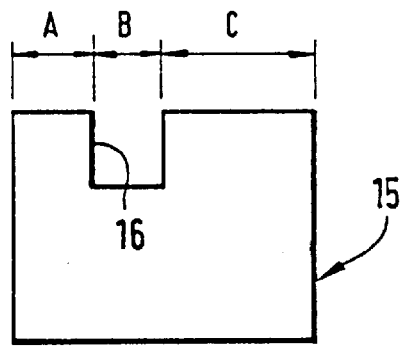
Figure 3B:
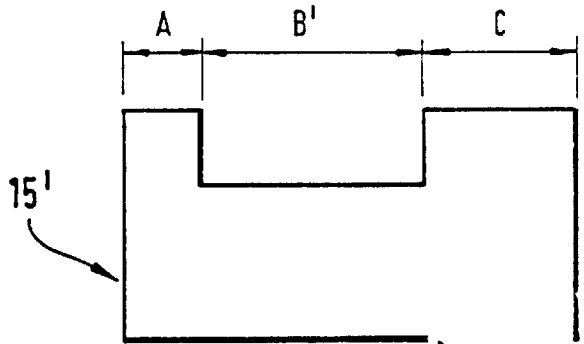

Turning now to FIG. 3, FIG. 3A shows a third planar design 15 with a gap 16 similar to gap 11 of FIG. 1A and with same dimensions A, B, and C. If dimension B is modified as shown in FIG. 3B with modified planar design 15, implicit constraints and dimensions are now in contradiction to topology, as shown at 17 in FIG. 3B, if the bottom line of third planar design 15 or 15', respectively, is designated by a CAD user as a fixed length instead of a designation signifying the interconnection of two given points.

Frequently, functional requirements for a design do not only determine the dimensions of a geometric design but also the structure of a design. In these cases, structural as well as dimensional parameters are needed to describe the design. FIG. 4A and 4B show a first example of a fourth planar design 20 and 20', respectively, where unmodified planar design 20 is provided with four holes 21', distributed along a quadrangle. Modified planar design 20 of FIG. 4B instead shows six holes 21' as may be the case when through-holes in a plate (for fixture) depend on the size of the plate.

A second functional requirement example is shown in FIGS. 5A and 5B, respectively. A spring 22 in FIG. 5A of length L is modified into spring 22' of FIG. 5B with modified length L, where the number of windings of the spring 22, 22' depends on specific load requirements.

A third functional requirement example is shown in FIGS. 6A and 6B, respectively. A fifth planar design 23 is shown having a circular set of thread holes 24 as is the case, e.g., in a gear-box dependent on the fastening configuration in the assembly. Whereas three circularly distributed holes 24 are used in planar design 23 of FIG. 6A, six such circularly distributed holes 24 are used in modified planar design 23 of FIG. 6B.

With prior systems in the cases of FIGS. 4 through 6, all particular designs either needed to be designed explicitly or a program had to be written by the user that captured the generic design and generated the particular design according to input parameters.

The employment of prior interactive dimension-driven CAD systems that only support the design operation with dimensional parameters to account for topology consequences due to dimension or function changes, is rather awkward and only possible in some special cases. It would require that a master model be created which covers the most complex structural configuration. For the generation of variants from such master model, dimensions of unwanted structural elements would need to be set to zero. The explicit design of the most complex situation is rather time consuming. However, an even bigger problem is the fact that often the maximum structure is not known in the beginning.

Figure 7:
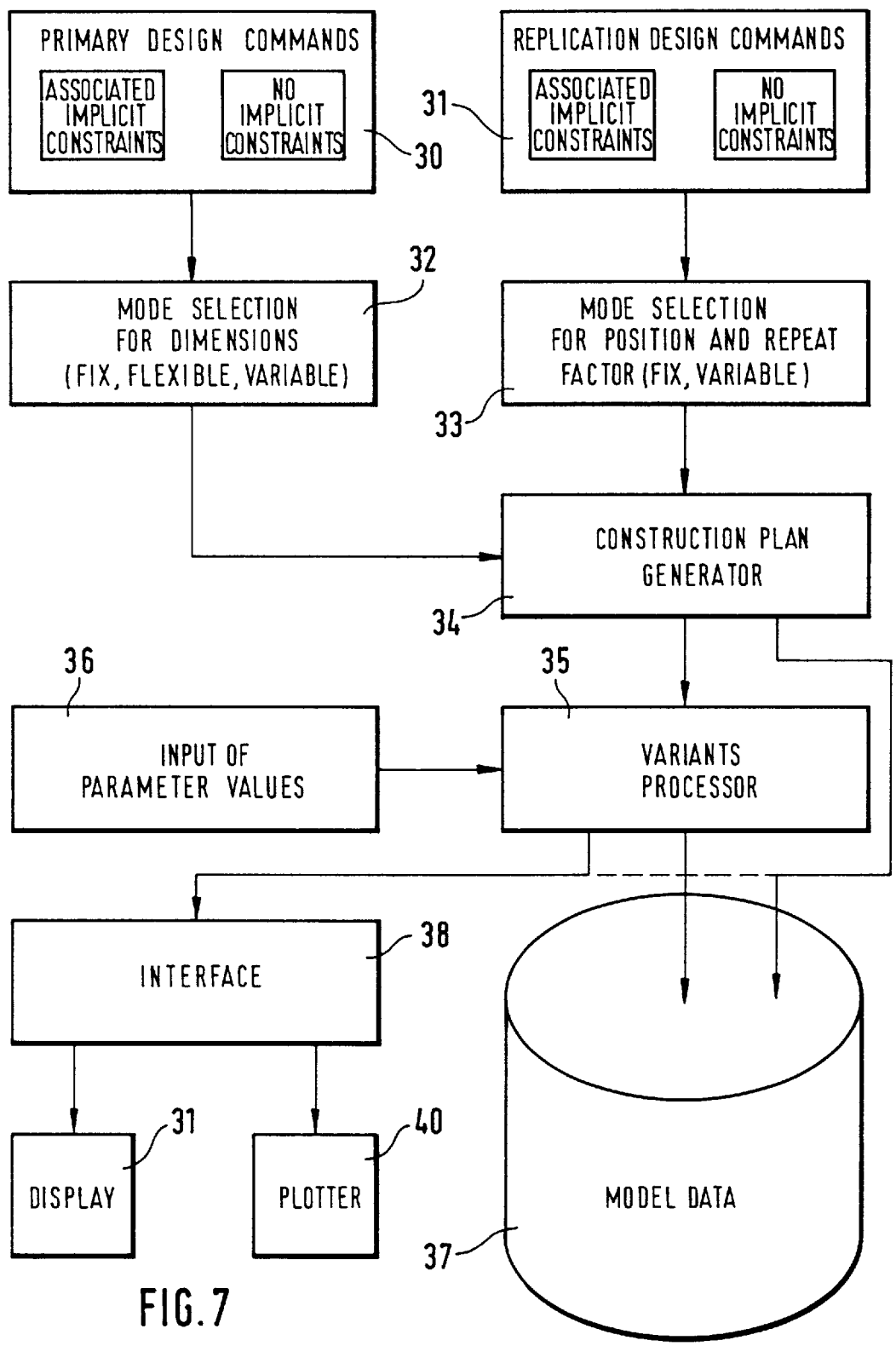
FIG. 7 shows a block diagram illustrating the architecture of a system according to the invention.

According to the present invention, a new method and system is used that supports the design of dimensional as well as structural variants in a graphically interactive manner. The architecture of a system based on this method is shown in FIG. 7. The method and system according to the present invention employs two main sets of design commands. As identified in FIG. 7, the invention employs primary design commands 30 as well as replication design commands 31. Both types of commands may be inputted into a computer aided design system according to the present invention by means of an user Input interface, e.g., a conventional keyboard and/or a graphics tablet. For the purpose of the present example, it may be assumed that such interface is a graphics tablet.

Known graphics tablets comprise a set of keys which are used to enter design commands, i.e., by pressing an appropriate pen on predefined areas of the graphics tablet. Other keys may be used for further functions, e.g., HELP, PLOT, etc., for example, as described in detail in the above referenced U.S. Patent Application.

In the present invention, primary design commands 30 support the initial design of geometric elements. These commands are comparable to the design commands, as explained in detail in the previously referenced co-pending U.S. Patent Application. They can be divided into two sub-classes, one that relates implicit dimensional constraints (e.g., LINE HORIZONTAL, LINE VERTICAL, LINE PARALLEL, etc.) to the command, and another sub-class that does not impose any implicit dimensional constraints by the use of a command (e.g., LINE__BETWEEN__TWO__ POINTS) All of the commands in both subclasses can be executed in the modes FIX, FLEXIBLE, or VARIABLE, as identified by reference numerals 32 and 33 in FIG. 7.

In FIX mode, the command will generate a geometric element with fixed dimensions. The VARIABLE mode associates variables to the dimensions of the created elements. Variables with consecutive indices can be generated automatically at the time of performing a primary design command in VARIABLE mode. The FLEXIBLE mode generates elements that fit between two existing points (as e.g., was not the case in the representation of FIG. 3B). In this case, the dimensions are determined implicitly.

Replication design commands 31, on the other hand, are used to design geometric elements or groups of elements that have multiple occurrences in the design. Examples of replication design commands are:

ROTATE: The result of this command is the generation multiple copies of a set of selected geometric elements which are placed in a circular configuration with specified angles and distances from a center point.

COPY HORIZONTAL: The result of this command is the generation of multiple copies of a selected set of geometric and/or annotation elements placed at specified distances along a horizontal axis.

COPY VERTICAL: Analogous to copy horizontal, the result of this command is the generation of multiple copies along a vertical axis. Additionally, the axis along which multiple copies of the selected set of elements is generated may be oriented other than 90 degrees or 0 degrees with respect to the horizontal or vertical axis, respectively.

SCALE: The result of this command is the generation of multiple scaled copies of selected geometric elements at specific locations.

Replication design commands 31 can be executed either in FIX mode or VARIABLE mode, as can be seen at reference numeral 33, similar to the mode selection for primary design commands at 32. In the FIX mode, the number of replications that are being performed by the command are fixed as well as the positions for the generated replications. In the VARIABLE mode, variables are generated and associated with the number of replications as well as to position parameters. Mixed modes could also be supported.

The use of a replication command in the VARIABLE mode results in a novel variable replication command, i.e., a replication operation which is variable with respect to the number of replications as well as the position and/or orientation of the replicated designs. As will be explained in greater detail in relation to FIG. 7, variable replication commands are realized by storing the command and information relating to the command while only executing the command in relation to a display. For example, use of the ROTATE command in the VARIABLE mode results in the storage of the ROTATE command, together with the fixed central point and variables associated with the particular design. If one were designing a fan utilizing the ROTATE command of the present invention, the variables N for the number of blades and α for the angular separation of each blade would be stored.

During a design session, all design commands entries are sent as input to a construction plan generator 34. In the preferred embodiment, construction plan generator 34 is realized in a processor or computer that generates a generic design program as an output. This generic design program consists of a sequence of design commands, including replication commands, where repeat factors and all geometric points are stored using variables. Points of geometric elements that have been generated in the FIX mode are also stored. The entry of such points in the FIX mode only imposes fixed dimensions to elements but not fixed locations.

In order to better understand the operation of construction plan generator 34, consider an example on which a triangle is constructed by the following primary design commands entered at 30 in the variable mode entered at 32 in FIG. 7:

1. VAR_LINE_HORIZONTAL_LENGTH ($x_1$, $y_1$, $L_1$)—This design command would generate a horizontal line with variable length $L_1$ starting at point $P_1$ ($x_1$, $y_1$);
2. VAR_LINE_ANGLE_LENGTH ($x_2$, $y_2$, $\alpha_2$, $L_2$)—This design command generates a line starting at the end point $P_2$ ($x_2$, $y_2$) of the first line, inclined at an angle $\alpha_2$ and having a length $L_2$; and
3. VAR_LINE_BETWEEN_POINTS ($x_2$, $y_2$; $x_1$, $y_1$)—This design command generates a line of variable length and inclination which, in any case, connects points $P_2$ ($x_2$, $y_2$) and $P_1$ ($x_1$, $y_1$).

The primary design commands are translated by construction plan generator 34 into "line between points" commands in order to generate the generic design program. In other words, any variants generated for the purposes of display result from a point model of the object and some knowledge of how such points are connected, mainly, by straight lines, arcs, etc. Continuing with the example, construction plan generator 34 would create a generic design program for the triangle as follows:

$P_1(x_1,y_1)=(0,0)$ $P_2(x_2,y_2)=(x_1-L_1,y_1)$

VAR_LINE_BETWEEN_POINTS $P_1,P_2$ $P_3(x_3,y_3)=(x_2+L_2\cos\alpha_2,y_2+L_2\sin\alpha_2)$

VAR_LINE_BETWEEN_POINTS $P_2,P_3$

VAR_LINE_BETWEEN_POINTS $P_3,P_1$

From the above it may not be readily apparent how the generic design program is utilized in relation to the replication design commands in order to generate a variable replication command. In short, such variable replication commands are achieved in the present invention by matrix mapping the variable design commands. For example, a longitudinal replication command, i.e., COPY HORIZONTAL or COPY VERTICAL, may be represented by the following equation:

$$(x_2, y_2, 1) = (x_1, y_1, 1) \begin{bmatrix} 1 & 0 & 0 \\ 0 & 1 & 0 \\ \Delta x & \Delta y & 1 \end{bmatrix}$$

It is evident that the above matrix equation corresponds to $(x_2,y_2,1)=(x_1+\Delta x,y_1+\Delta y,1)$. As a result of such matrix mapping, construction plan generator 34 need simply generate and store the quadratic matrix when including a variable replication command in a generic design program. Variants processor 35, in generating a variant, substitutes parameter values for $\Delta x$ and $\Delta y$. In relation to the ROTATE replication command, the following matrix map may be utilized:

$$(x_2, y_2) = (x_1, y_1) \begin{bmatrix} \cos\alpha & -\sin\alpha \\ \sin\alpha & \cos\alpha \end{bmatrix}$$

Such a matrix equation corresponds to $x_2=x_1\cos\alpha+y_1\sin\alpha$ and $y_2=-x_1\sin\alpha+y_1\cos\alpha$. In this fashion, construction plan generator 34 stores variable replication commands.

From the generic design program, variants are generated through variants processor 35 in relation to specific parameter values. Variants processor 35, in the preferred embodiment, consists of CAD routines implemented in a computer. Processor 35 replaces variables contained in the generic design program with actual values inputted at 36 and performs a sequence of elementary design commands. The production of variants is fast, because the construction plan or generic design program generated by construction plan generator 34 includes the complete set of necessary operations in the proper sequence. In fact, the generation of a variant is done in about the time an infinitely fast user would need to input the design.

The entire set of data generated by variants processor 35 are now stored in model data memory 37 and are, in parallel, fed to an interface 38 for presenting the generated design on a display 39, e.g., a graphic CRT, or printed out on a conventional plotter 40.

Figure 8:
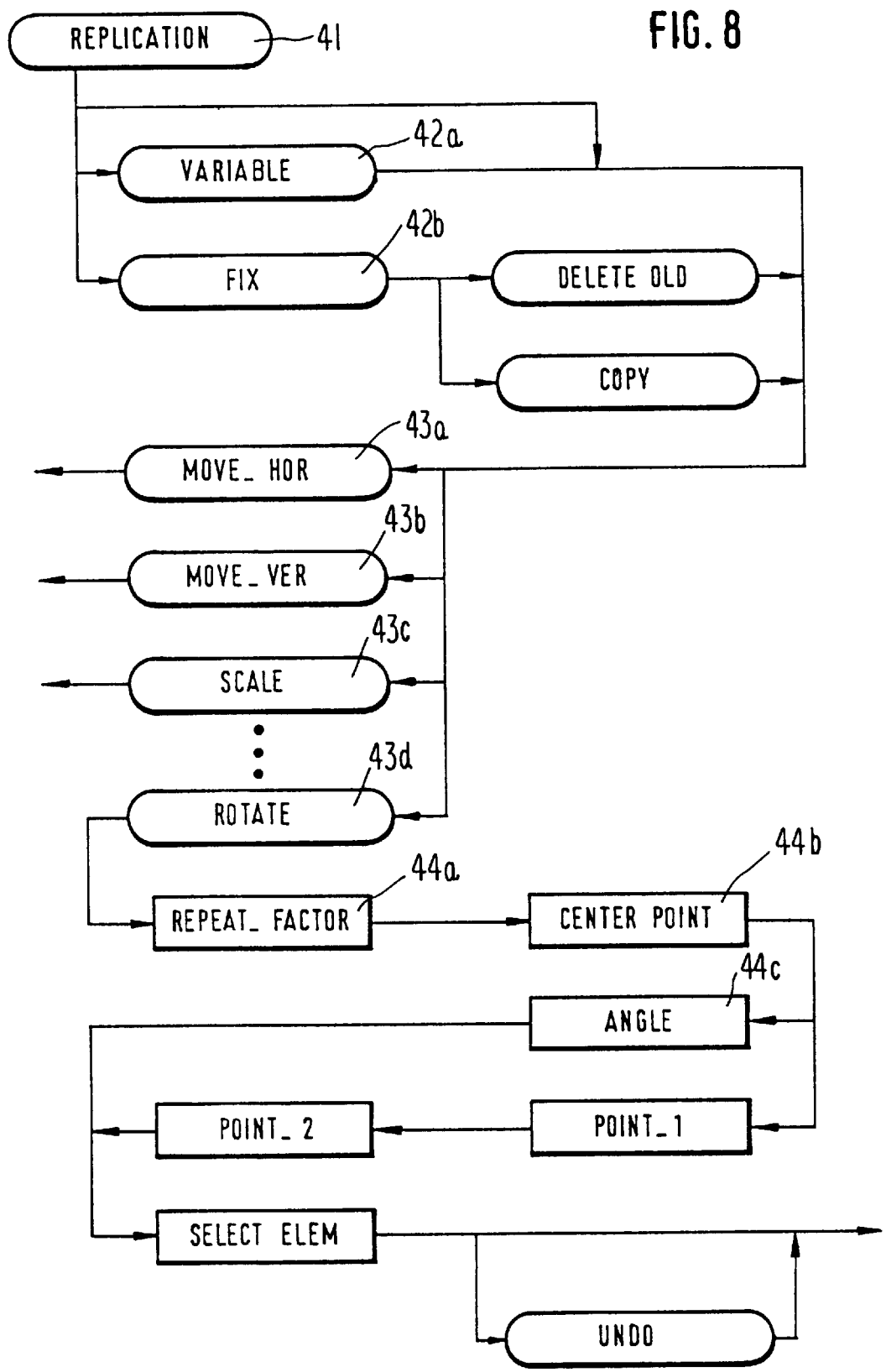
FIG. 8 shows a flow diagram for a replication design command.

FIG. 8 is a simplified representation of a flow diagram for a replication design command being operated upon by variants processor 35. The command ROTATE is particularly illustrated. Since the other replication commands are operated upon in a similar manner, they are not shown in any greater detail. After inputting the replication command at 41 which may comprise one or more replication functions, and selecting the VARIABLE or FIX mode at 42a or 42b, the various replication design functions may be selected for example, MOVE_HOR at 43a, MOVE_VER at 43b SCALE at 43c, or ROTATE at 43d. In the latter case, a REPEAT-FACTOR is selected at 44a representing the number of copies which are to be arranged about a common CENTER POINT selected at 44b, each at a predetermine ANGLE set at 44c. Values inputted at 36 in FIG. 7 and substituted into the generic design program at 44a, b, and c enable the performance of the ROTATE replication design command.

Of course, the selection of the FIX or VARIABLE mode at 42a and 42b could be done also for each replication design command separately. Commands that perform similar operations to the above described replication design commands in FIX mode can be found in conventional CAD systems. However, such known commands do not impose any implicit constraints to the created data and do not provide the possibility to change any parameters after being used. Therefore, such prior commands are of no use for interactive structural and dimensional parametric design. The similarity of existing commands for rigid design makes a parametric system based on the proposed method easy to use and learn, particularly for users that are already familiar with a conventional CAD system.

Figure 9:
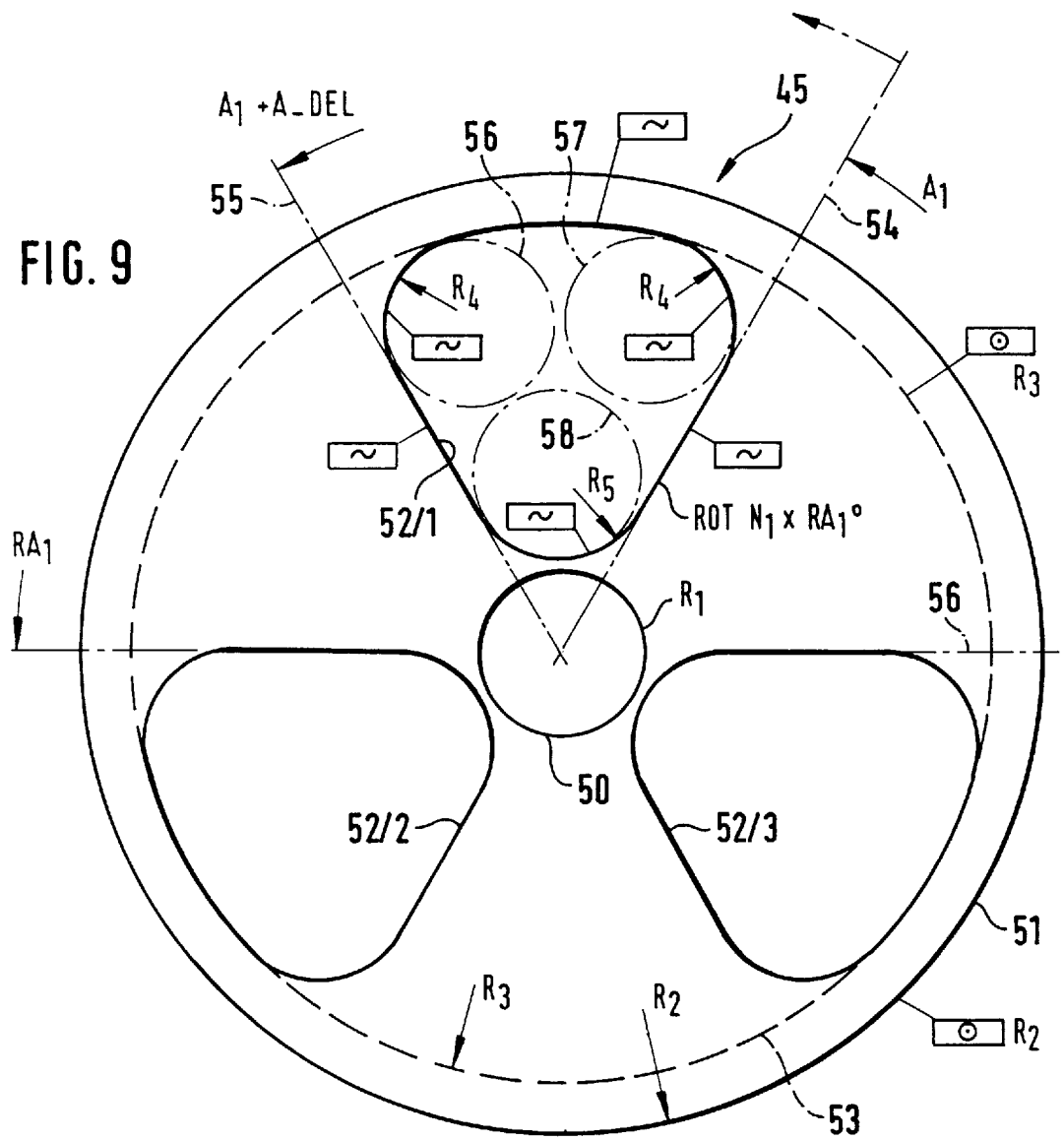
FIG. 9 shows a design example of a wheel with eccentric gaps.

FIG. 9 shows an example to demonstrate the design capability of the method and system of the present invention step by step on the example of a wheel 45. First, a center hole 50 and an outer contour 51 of the wheel 45 are created using primary design commands in the VARIABLE mode. The corresponding variable radii are $R_1$ and $R_2$.

In the next step, an eccentric gap 52/1 is designed in the wheel 45. The complete design will include an arbitrary number of such eccentric gaps 52, placed at locations with a given but variable offset to the center. However, one explicitly designs only the first gap 52/1 and then uses the replication design command ROTATE to create a variable number of, say, two replications 52/2, 52/3 at locations defined by a location parameter.

As a preparation for the creation of the geometry elements for the first gap 52/1, one designs a construction circle 53 with radius $R_3$ concentric to the outer contour 51 with radius $R_2$. Construction geometry elements are unbound lines and are created using primarily design commands. They are shown as dotted lines in FIG. 9 Then, two straight construction lines 54, 55 with angles $A_1$ and $A_1+A\_DEL$ in respect to a horizontal plane.

Now, construction circles 56, 57, and 58 are drawn to support the variable fillet radii $R_4$ and $R_5$ These construction circles 56 through 58 are placed tangential to the before generated construction elements 53, 54, and 55. After the placement of the construction elements 53 through 58, an OVERDRAW command is given to draw the contour of the eccentric gap 52 based on the construction line of elements 53 through 58. The lines created with the OVERDRAW command are determined by the intersection points of the construction lines of elements 53 through 58. Therefore, they are stored as flexible lines.

In the next step, the replication design command ROTATE is performed. In more detail, this command is performed with the following inputs (c.f. FIG. 8):

REPLICATION

VARIABLE

ROTATE, repeat factor

CENTER, fix point, angle

SELECT, elements

The expressions in Capital letters hereby denote command keystrokes, whereas the attributes attached and separated by commas are additional inputs, needed to specify the action. The value for the repeat factor variable has been chosen to be three in the generic design. As a result, we now have the design complete as it is shown in FIG. 9. The parameters that have been created during the above described interactive design session are:

dimensional parameters: $R_1$ $R_2$ $R_3$ $R_4$ $A_1$ $A\_DEL$ structural parameters: $N_1$ $RA_1$ where $N_1$ is the number of replications (including the first generated design) and $RA_1$ is the angle of rotation between the first generated design and the second, copied design and, Consecutively, any further copied design.

FIG. 9, further, shows interactive graphic elements, namely constraint icons for indicating constraints as e.g. indicating that outer contour 51 and construction circle 53 are concentric and that the contour of eccentric gaps have to fit between Connection Points (of construction elements 53 through 58). These icons are placed automatically as a graphical feedback for the user about the imposed Constraints.

Figure 10:
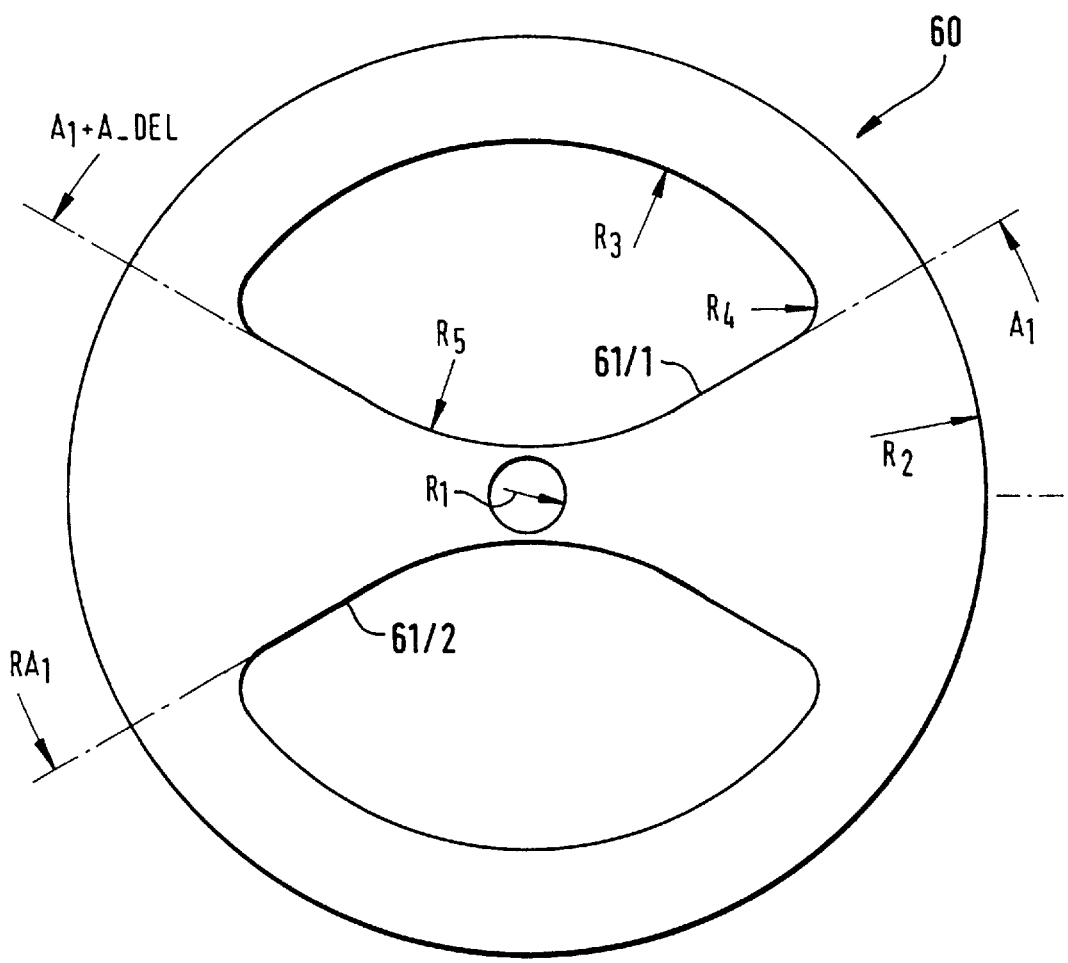
FIGS. 10 and 11 show generic variants of the example of FIG. 9.
Figure 11:
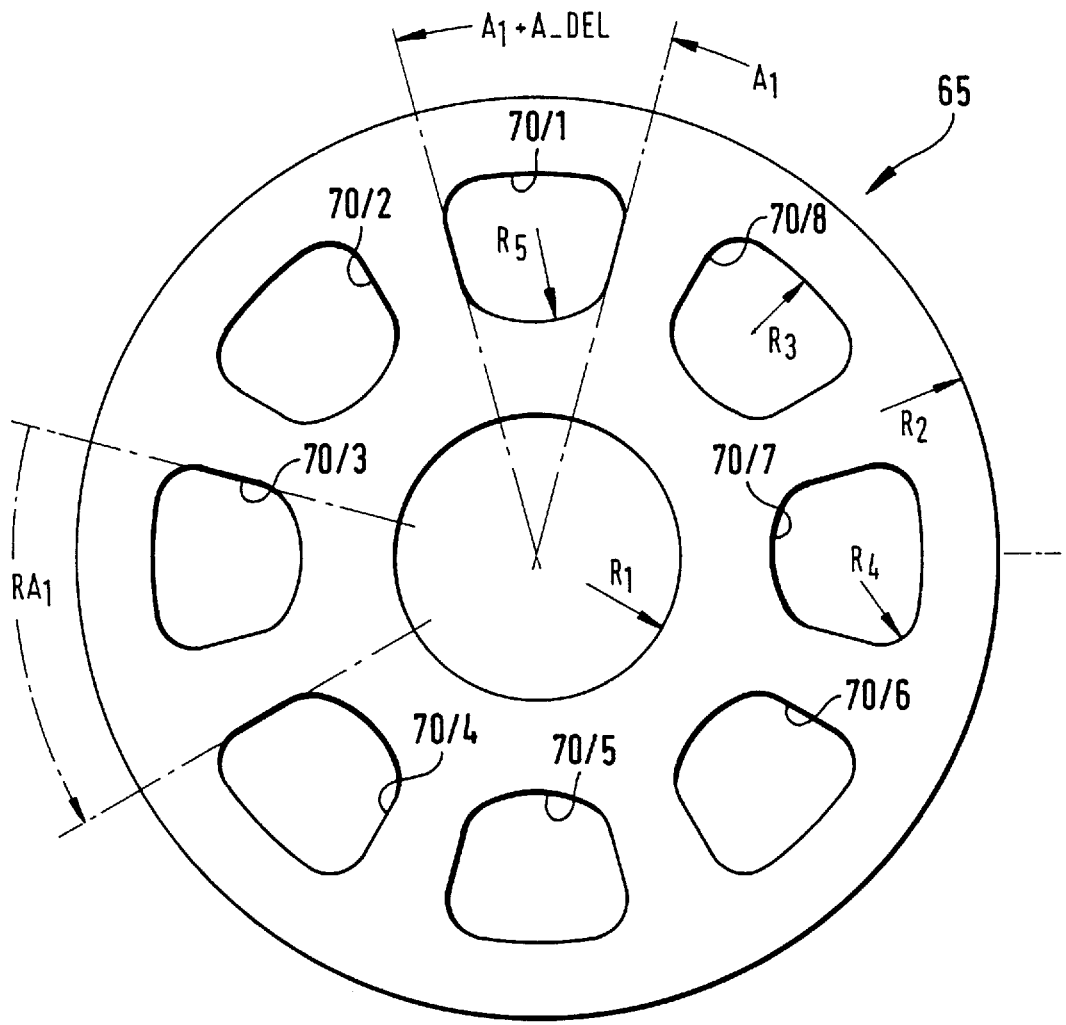

FIGS. 10 and 11 show two variants of the design for given sets of parameters.

In FIG. 10, a wheel 60 is generated from the generic design program in relation to FIG. 9 wherein two eccentric gaps 61/1 and 61/2, respectively, are provided by the parameters specified on the right margin of FIG. 10.

In contrast, a wheel 65 is provided with eight eccentric gaps 70/1 through 70/8 with the dimensional and structural parameters as also specified on the right margin of FIG. 11.

The terms "geometric" or "geometric element", in this application, comprises elementary geometric elements like dots, lines, circles, etc. as well as annotations like hatchings, alphanumeric symbols, words, surface quality symbols, etc.

What is claimed is:

1. A method for generating a generic program of a graphical model of a 2- or 3-dimensional object with at least partially variable dimensions, in a computer aided design system, said design system having design commands, said method comprising the steps of;

selecting a sub-group of geometric elements corresponding to a structural element of said object, wherein said geometric elements are defined by a set of said design commands;

generating a replication command having replication parameters defined as variables, said replication parameters being generated in relation to said sub-group of geometric elements, wherein said step of generating said replication command comprises matrix mapping said set of design commands;

incorporating said replication command and said replication parameters into a design program thereby generating a generic design program and storing said generic design program, wherein said replication command is stored in an unexecuted form so that when it is desired to replicate said set of said design commands to generate a model having a number of said structural element, said number is variable.

* * * * *